United States Patent
Lee et al.

(10) Patent No.: US 11,295,785 B2
(45) Date of Patent: Apr. 5, 2022

(54) MEMORY SYSTEM STORAGE DEVICE INCLUDING PATH CIRCUIT IN PARALLEL WITH AUXILIARY POWER DEVICE

(71) Applicant: SAMSUNG ELECTRONICS CO., LTD., Suwon-si (KR)

(72) Inventors: Woosung Lee, Seoul (KR); Chunghyun Ryu, Hwaseong-si (KR); Hyoungtaek Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/877,752

(22) Filed: May 19, 2020

(65) Prior Publication Data
US 2021/0074332 A1    Mar. 11, 2021

(30) Foreign Application Priority Data
Sep. 9, 2019   (KR) .................. 10-2019-0111567

(51) Int. Cl.
*G11C 5/00*   (2006.01)
*G11C 5/14*   (2006.01)

(52) U.S. Cl.
CPC .............. *G11C 5/005* (2013.01); *G11C 5/141* (2013.01)

(58) Field of Classification Search
None
See application file for complete search history.

(56) References Cited

U.S. PATENT DOCUMENTS

| | | | |
|---|---|---|---|
| 7,550,947 B2 | 6/2009 | Sakurai et al. | |
| 9,430,011 B2 | 8/2016 | Chiasson et al. | |
| 9,952,268 B1 | 4/2018 | Saxena et al. | |
| 2001/0028571 A1* | 10/2001 | Hanada | H02J 7/345 363/50 |
| 2012/0224446 A1* | 9/2012 | Hauck | G11C 5/141 365/229 |
| 2019/0162797 A1 | 5/2019 | An et al. | |

FOREIGN PATENT DOCUMENTS

| | | |
|---|---|---|
| JP | 1996-227385 | 9/1996 |
| JP | 3829037 | 10/2006 |
| JP | 2012-122910 | 6/2012 |
| KR | 10-1556283 | 9/2015 |

\* cited by examiner

*Primary Examiner* — J. H. Hur

(57) ABSTRACT

A memory system and storage device are provided, including: an auxiliary power device having at least one capacitor, wherein the at least one capacitor has a first path for leakage current; a charging circuit including a switch connected to the auxiliary power device; and a state determining circuit connected to the auxiliary power device, wherein the state determining circuit includes a path circuit connected in parallel with the at least one capacitor to form a second path having at least one of a resistance lower than a resistance of the first path or a current source.

20 Claims, 13 Drawing Sheets

MEMORY SYSTEM STORAGE DEVICE INCLUDING PATH CIRCUIT IN PARALLEL WITH AUXILIARY POWER DEVICE

CROSS-REFERENCE TO RELATED APPLICATION

This application claims priority under 35 U.S.C. § 119 to Korean Patent Application No. 10-2019-0111567, filed on Sep. 9, 2019 in the Korean Intellectual Property Office, the disclosure of which is incorporated by reference herein in its entirety.

TECHNICAL FIELD

Exemplary embodiments of the inventive concept relate to externally powered memory devices, and more particularly, to an auxiliary power device that subordinately supplies auxiliary power, and a memory system including the auxiliary power device.

DISCUSSION OF RELATED ART

Generally, a memory system including memory devices and a memory controller operates with power supplied from an external source. A sudden power off (SPO) situation may occur in which power is suddenly interrupted during an operation of the memory system. In cases where the memory controller stores data by using a volatile memory, data stored in the volatile memory may be lost or an operation (e.g., an erase operation, a write operation, or the like) executed by the memory device may not be completed.

SUMMARY

Exemplary embodiments of the inventive concept provide a storage device including a path circuit that provides a path of current to efficiently and accurately monitor a state of an auxiliary power device, as well as a memory system including the storage device. For example, the memory system may complete an operation being executed using the auxiliary power device and/or perform a data backup operation when a sudden power off (SPO) situation occurs.

According to an exemplary embodiment of the inventive concept, a storage device comprises: an auxiliary power device including at least one capacitor, wherein the at least one capacitor has a first path for leakage current; a charging circuit including a switch connected to the auxiliary power device; and a state determining circuit connected to the auxiliary power device, wherein the state determining circuit includes a path circuit connected in parallel with the at least one capacitor to form a second path having at least one of a resistance lower than a resistance of the first path or a current source.

According to an exemplary embodiment of the inventive concept, a memory device, comprises: measurement means for measuring a voltage of at least one capacitor in an auxiliary power circuit of the memory device, wherein the at least one capacitor has a first path for leakage current; detection means for determining a fault of the at least one capacitor by comparing a change time of the measured voltage with a reference time; path means for forming a second path being connected in parallel with the at least one capacitor; normal state means for determining a state of the auxiliary power circuit to be in a normal state if the voltage of the at least one capacitor periodically cycles between a first voltage level and a second voltage level that is lower than the first voltage level; and abnormal state means for determining the state of the auxiliary power circuit to be in an abnormal state if the voltage of the at least one capacitor aperiodically cycles or deviates from between the first voltage level and the second voltage level.

According to an exemplary embodiment of the inventive concept, a memory system includes: a power loss protection (PLP) circuit having an auxiliary power device including at least one capacitor; a charging circuit including a switching circuit connected with the auxiliary power device that is turned on and off and configured to supply power to the auxiliary power device; a main system circuit including a controller and at least one memory chip; and a power block arranged between the PLP circuit and the main system circuit and configured to supply power to the main system circuit, wherein the PLP circuit comprises a state determining circuit configured to measure a voltage of the at least one capacitor and determine a fault of the at least one capacitor by comparing a change time of the measured voltage with a reference time, and the state determining circuit comprises a path circuit connected in parallel with the at least one capacitor and configured to form a second path having a resistance value that is less by a threshold value than a resistance value of a first path for leakage current of the at least one capacitor.

BRIEF DESCRIPTION OF THE DRAWINGS

Exemplary embodiments of the inventive concept may be more clearly understood from the following detailed description when taken in conjunction with the accompanying drawings, in which.

DETAILED DESCRIPTION

Exemplary embodiment memory systems may complete an operation being executed and/or perform a data backup operation using an auxiliary power device when a sudden power off (SPO) or like situation occurs. Hereinafter, exemplary embodiments of the inventive concept will be described with reference to the accompanying drawings.

Figure 1:
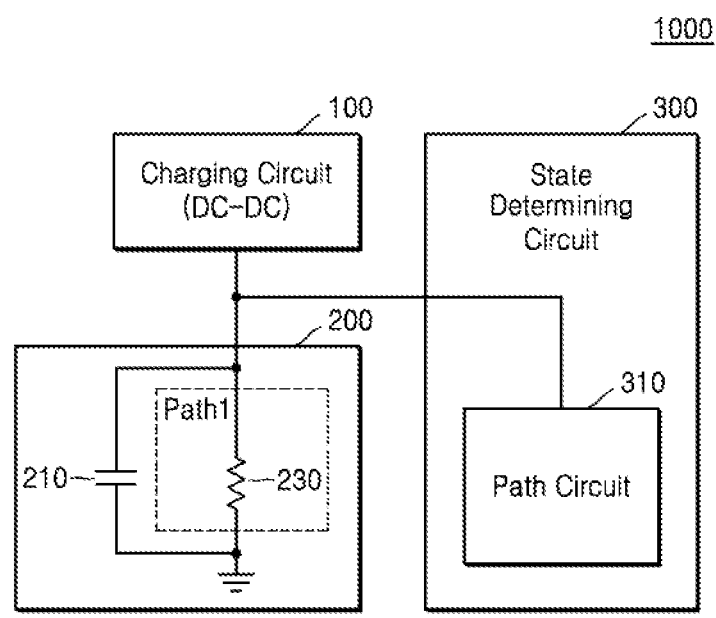
FIG. 1 is a schematic block diagram of a storage device including a path circuit according to an exemplary embodiment of the inventive concept.

FIG. 1 illustrates a storage device including a path circuit according to an exemplary embodiment of the inventive concept. Referring to FIG. 1, a storage device 1000, including a path circuit according to an exemplary embodiment of the inventive concept, may include a charging circuit 100, an auxiliary power device 200 connected to the charging circuit, and a state determining circuit 300 connected to the charging circuit and the auxiliary power device, where the state determining circuit 300 may include a path circuit 310.

The charging circuit 100 may supply power to the auxiliary power device 200. For example, the charging circuit 100 may be implemented with, but shall not be limited to, a direct current (DC)-DC converter.

The charging circuit 100 of the storage device 1000 according to an exemplary embodiment of the inventive concept may include a switching circuit connected with the auxiliary power device 200 to be turned on or off. The switching circuit may supply power to the auxiliary power device 200 or block the power as a switch is turned on or off, respectively. The charging circuit 100 may supply a voltage to the auxiliary power device 200 to charge the auxiliary power device 200.

A charging operation of the charging circuit 100 may be represented by a switch on/off state of the switching circuit. The charging operation of the charging circuit 100 may also be represented by a switching profile of the DC-DC converter. A switching profile may refer to information in which an on/off state of a field effect transistor (FET) included in the DC-DC converter is expressed over time when the FET functions as a switch. The charging circuit 100 may be described in more detail with reference to FIGS. 2, 3, 6, and 7A through 7C.

At least one capacitor 210 may be connected to the auxiliary power device 200. The capacitor 210 may, in implementation, include an insulating resistor 230 due to physical properties, and leakage current of the capacitor 210 may flow through a path including the insulating resistor 230. Referring to FIG. 1, the path including the insulating resistor 230 is illustrated as a first path Path1.

While one capacitor is illustrated in FIG. 1 for convenience of description, various connection methods among a plurality of capacitors, such as serial connection, parallel connection, and a combination of serial connection/parallel connection, may be used without being limited to the illustration. A capacitor connection method for the auxiliary power device 200 may be described in more detail with reference to FIGS. 4A and 4B.

Each of a plurality of capacitors may each have a corresponding insulating resistor, such that there may be a plurality of insulating resistors. However, for convenience of description herein, it shall be understood that all such insulating resistors may be converted into or considered as one equivalent insulating resistor 230.

The capacitor 210 may be an electrolytic capacitor, a film capacitor, a tantalum capacitor, a ceramic capacitor, or the like.

The electrolytic capacitor may use a thin oxide film for a dielectric and aluminum for an electrode, thus being also referred to as an aluminum (Al) capacitor. The electrolytic capacitor has good low-frequency properties and may be implemented with a high volume up to several tens of thousands of μF. The tantalum capacitor includes an electrode formed of tantalum (Ta) and may have greater temperature and frequency properties than those of the electrolytic capacitor.

The film capacitor may be structured such that a film dielectric such as polypropylene, polystyrol, Teflon, or the like, is inserted into an electrode such as aluminum, copper, or the like, and is rolled. The film capacitor may have a volume and a purpose that differ with a material and a manufacturing process. A biaxially-oriented polyethylene terephthalate (BoPET) capacitor, which may be relatively inexpensive among film capacitors, is a cylindrical capacitor made by inserting a polyester film into metal, and may be used mainly for a high-frequency circuit, an oscillating circuit, or the like.

For a ceramic capacitor, a high-permittivity material such as titanium-barium may be used as a dielectric. The ceramic capacitor has good high-frequency properties and may be used to pass noise through ground. A multi-layer ceramic condenser (MLCC), which is a sort of ceramic capacitor, may use multi-layer high-permittivity ceramic as a dielectric between electrodes. The MLCC may be used for a bypass due to its good temperature and frequency properties and small size.

In the storage device 1000 according to an exemplary embodiment of the inventive concept, the capacitor 210 of the auxiliary power device 200 may include a tantalum capacitor having a low equivalent series resistance (ESR), an aluminum capacitor, an MLCC, or the like. However, the particular material of the capacitor 210 of the auxiliary power device 200 may be varied without being limited to the foregoing examples.

The auxiliary power device 200 may be supplied with power from the charging circuit 100 such that the capacitor 210 may be charged. When electric charge is accumulated in the capacitor 210 by charging from the charging circuit 100, causing a voltage of the capacitor 210 to reach a first voltage, charging from the charging circuit 100 may be stopped. Upon the stop of charging in the capacitor 210, a natural discharge occurs where the electric charge slowly flows out, such that a voltage of the capacitor 210 is slowly dropped. When the voltage of the capacitor 210 drops and reaches a second voltage, a charging operation of the charging circuit 100 is resumed and thus the capacitor 210 of the auxiliary power device 200 may be recharged with a replenished electric charge.

When the state of the auxiliary power device 200 is normal, the charging operation of the charging circuit 100 may be repeated at preset intervals. However, when the state of the auxiliary power device 200 is abnormal, such as, for example, when a fault such as a short or open occurs in some of a plurality of capacitors 210 of the auxiliary power device 200, the charging operation of the charging circuit 100 may have different aspects than when the state of the auxiliary power device 200 is normal. Thus, by measuring and analyzing the charging operation of the charging circuit 100, the state of the auxiliary power device 200 may be determined. In other words, a fault of a capacitor 210 of the auxiliary power device 200 may be determined.

The state of the auxiliary power device 200 may be determined by measuring and analyzing a switch on or off state of the switching circuit. The state of the auxiliary power device 200 may be determined by measuring and analyzing the switching profile of the DC-DC converter. State measurement and analysis performed by the auxiliary power device 200 may be described in more detail with reference to FIGS. 6 and 7A through 7C.

When a sudden power off (SPO) situation occurs where external power supply is stopped to an electronic system to which power is to be supplied, such as, for example, a memory system, the auxiliary power device 200 may supply auxiliary power to the memory system. More specifically, the auxiliary power device 200 may complete an operation being performed and perform a data backup operation by supplying energy accumulated in the capacitor 210 to the memory system. According to an exemplary embodiment of the inventive concept, in the SPO situation, the memory system may receive a temporary power supply from the auxiliary power device 200 and store data in a non-volatile storage device such as a NAND flash, or the like, to perform a backup operation. However, in the presence of a fault in the auxiliary power device 200, proper power might not be supplied to the memory system in the SPO situation, causing a significant data loss in the memory system. To prevent data loss of the memory system in the SPO situation, the auxiliary power device 200 may be monitored periodically or substantially continuously in real time, and the state of the auxiliary power device 200 may be checked such that, in the presence of a fault, the auxiliary power device 200 may be repaired or replaced.

The state determining circuit 300 of the storage device 1000 according to an exemplary embodiment of the inventive concept may measure and analyze the charging operation of the charging circuit 100 and the voltage of the capacitor 210 included in the auxiliary power device 200 to determine the state of the auxiliary power device 200. For example, the charging operation of the charging circuit 100 may be represented by the switch on/off state of the switching circuit or the switching profile of the DC-DC converter, and the state determining circuit 300 may determine the state of the auxiliary power device 200 by measuring and analyzing the switch on/off state of the switching circuit or the switching profile of the DC-DC converter. The voltage of the capacitor 210 may be measured and analyzed to determine a fault of the capacitor 210, thus determining a fault of the auxiliary power device 200.

The state determining circuit 300 may determine a fault of the capacitor 210 by monitoring the voltage of the capacitor 210. More specifically, the state determining circuit 300 may determine, according to a change of a voltage level of the capacitor 210, whether the state of the auxiliary power device 200 is normal. For example, the state determining circuit 300 may compare a time taken for a voltage drop of the capacitor 210 from the first voltage to the second voltage with a reference time, and compare a time taken for a voltage rise of the capacitor 210 from the second voltage to the first voltage with a reference time.

The auxiliary power device 200 maintains a state of being charged with at least enough preset energy to back up the storage device 1000 during a preset time in the SPO situation. Thus, the state determining circuit 300 may measure the voltage of the capacitor 210 and determine energy stored in the auxiliary power device 200 by calculating an effective capacitance, thus determining whether the auxiliary power device 200 is in the normal state.

The state determining circuit 300 of the storage device 1000 according to an exemplary embodiment of the inventive concept may include the path circuit 310 connected in parallel with the auxiliary power device 200. The path circuit 310 may be configured to form a second path Path2 having a resistance value that is less than that of the first path through which the leakage current of the capacitor 210 flows. More specifically, the resistance value of the second path may be implemented to be less than the resistance value of the first path by a threshold value. The threshold value may be previously determined to be a value that minimizes an influence of an element of the leakage current of the capacitor 210 when the state determining circuit 300 determines the state of the auxiliary power device 200. In other words, the second path may be configured to force the leakage current flowing in the capacitor 210 to flow through another path in addition to the first path inside the capacitor 210.

The capacitor 210 may have an insulating resistor originating from physical properties. The path circuit 310 may provide a path through which the leakage current of the capacitor 210, generated due to the insulating resistor, flows in a split manner. Referring to FIG. 1, a part of the leakage current may flow through the first path, and the other part of the leakage current may flow through the path circuit 310. At least one current path may be provided within the path circuit 310.

The leakage current flowing in the capacitor 210 may be changed by various internal or external environments or factors such as a lifetime of the capacitor 210, a temperature and a humidity of an electronic part, or the like. For example, an initial leakage current of the capacitor 210 used in the auxiliary power device 200 may be less than or equal to 5 µA, and a tolerable amount of a proper leakage current may be less than or equal to 100 µA. However, according to various use environments such as a use time of the storage device 1000, a temperature and a humidity of an environment where the storage device 1000 is used, or the like, the leakage current of the capacitor 210 may rise above 100 µA. In this case, by including the path circuit 310, the amount of the leakage current flowing in the capacitor 210 may be adjusted, and thus may return to a proper range, such as, for example, to 100 µA or less. In this way, by adjusting the amount of the leakage current flowing in the capacitor 210, the state determining circuit 300 may accurately measure and determine a fault of the auxiliary power device 200. Thus, the memory system 1000 may compensate for many faults, and provide a system alert for others. Measurement and analysis of the leakage current of the capacitor 210 and a fault of the auxiliary power device 200 may be described in greater detail with reference to FIGS. 6 and 7A through 7C.

The storage device 1000 including the path circuit 310 according to an exemplary embodiment of the inventive concept, may measure and analyze the charging operation of the charging circuit 100 in real time through the state determining circuit 300, thus monitoring the state of the auxiliary power device 200 in real time. Herein, the charging operation of the charging circuit 100 may be represented, for example, by the switching profile of the DC-DC converter, where the state determining circuit 300 may measure the switching profile of the DC-DC converter.

The storage device 1000 including the path circuit 310 according to an exemplary embodiment of the inventive concept may not perform an operation such as an operation of forcedly discharging the capacitor 210 of the auxiliary power device 200, because the state of the auxiliary power device 200 is monitored based on the naturally progressing charging operation of the charging circuit 100. Thus, the memory system to which power is supplied from the auxiliary power device 200 may be securely maintained, and a data backup state may be maintained at all times.

Generally, if an operation such as the forced discharge of the capacitor 210 were performed to monitor the state of the auxiliary power device 200, data loss might not be prevented upon occurrence of an actual SPO situation. Although a memory write mode might be changed considering occurrence of the SPO situation during the forced discharge, if the memory write mode is changed in advance regardless of the state of the auxiliary power device 200, the operating efficiency of the memory system may be degraded.

However, the storage device 1000 including the path circuit 310 according to an exemplary embodiment of the inventive concept does not need the forced discharge of the capacitor 210, removing a need for changing the memory write operation during monitoring of the auxiliary power device 200 and thus preventing the operating efficiency of the memory system from being degraded. Moreover, the amount of the leakage current may be adjusted with the path circuit 310, thus avoiding measurement distortion caused by the leakage current in determining the fault of the capacitor 210. Thus, the fault of the capacitor 210 may be more precisely measured, thereby improving the accuracy of determining whether the storage device 1000 is in an abnormal state.

Figure 2:
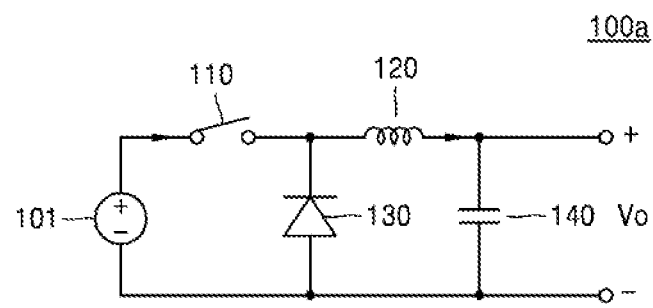
FIG. 2 is a schematic circuit diagram of a charging circuit according to an exemplary embodiment of the inventive concept.
Figure 3:
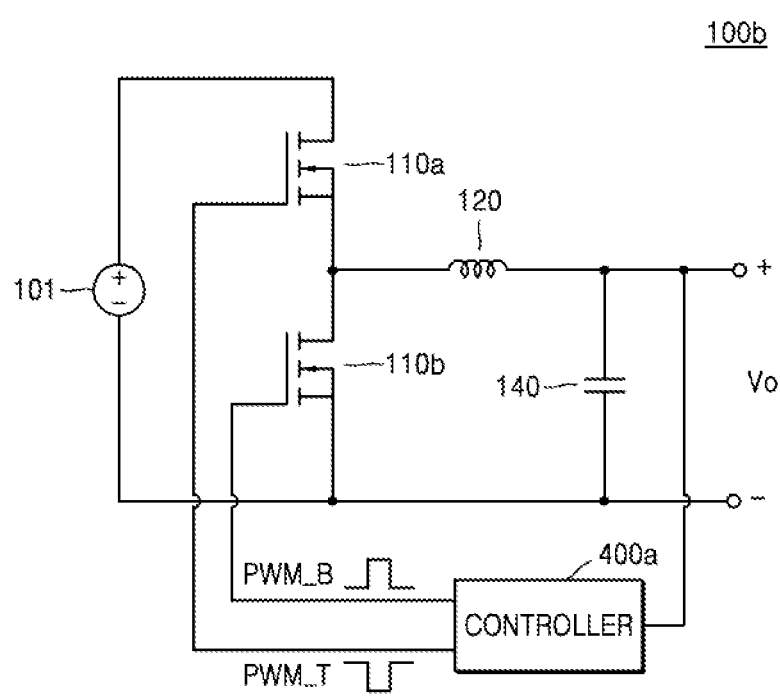
FIG. 3 is a schematic circuit diagram of a buck converter of a charging circuit according to an exemplary embodiment of the inventive concept.

FIGS. 2 and 3 illustrate in detail DC-DC converter examples of the charging circuit 100 of the storage device 1000 including the path circuit 310 of FIG. 1. FIG. 2 illustrates a simple buck converter configuration, and FIG. 3 illustrates a substantial buck converter configuration. To facilitate understanding, description may be made with reference to FIG. 1.

Referring to FIGS. 2 and 3, in the storage device 1000 including the path circuit 310 according to an exemplary embodiment, the charging circuit 100 may include a DC-DC converter. However, to facilitate understanding and describe a detailed application in detail, one device may be specified without limiting the charging circuit 100 to the DC-DC converter. For example, a buffer circuit including a switching element may also be used for the charging circuit 100.

The DC-DC converter may include a boost converter and a buck converter. The boost converter may be a converter that boosts an input DC voltage and outputs the same, and the buck converter may be a converter that drops the input DC voltage and outputs the same.

Referring to FIG. 2, in the storage device 1000 including the path circuit 310 according to an exemplary embodiment of the inventive concept, the charging circuit 100 may include a simple buck converter 100a that may include a switch 110, an inductor 120, a diode 130, and a capacitor 140. The capacitor 140 may be included in a buck converter 100a as is shown. However, the capacitor 140 may be treated as a part of the auxiliary power device 200 that is a charging target.

Referring to FIG. 2, when a switch 110 of the buck converter 100a is closed, a voltage is supplied from a power source 101 to an inductor 120, increasing a current flowing in the inductor 120, such that energy is accumulated in the inductor 120 and is delivered to an output end, thus increasing an output voltage Vo, i.e., the voltage of the capacitor 140. The diode 130 may be reverse-biased, such that current may not flow to the diode 130.

When the switch 110 is opened, a closed circuit including the inductor 120, the diode 130, and the capacitor 140 may be formed. The current flowing through the inductor 120 flows through the closed circuit and is slowly dropped, thus dropping the output voltage Vo, i.e., the voltage of the capacitor 140. This may be interpreted as a natural discharge of the capacitor 140. An average voltage of the output voltage Vo may be controlled according to a ratio of closed to opened time of the switch 110. When the switch 110 is closed, a maximum output voltage may be reached, and the output voltage may be equal to or less than an input voltage. The switch 110 may include, but is not limited to, an easily controlled field effect transistor (FET).

Referring to FIG. 3, a substantial buck converter 100b may include a pair of first and second switches 110a and 110b, the inductor 120, and the capacitor 140. Herein, the pair of switches 110a and 110b may include identical n-type FETs as is shown. However, the inventive concept is not limited to this example. For example, the pair of switches 110a and 110b may include an n-type FET and a p-type FET or identical p-type FETs, where for the n-type FET and the p-type FET, the same pulse width modulation (PWM) signal may be input to the pair of switches 110a and 110b. Moreover, the FETs may be of the enhancement type as shown, or one or both may be of the depletion type.

The buck converter 100b according to an exemplary embodiment of the inventive concept may operate in two modes according to an on or off state of each of the switches 110a and 110b.

For example, a first mode may be an operation mode when a first switch 110a is turned on and a second switch 110b is turned off, in which, as a voltage from the power source 101 is applied to the inductor 120, a current flowing in the inductor 120 increases such that energy is accumulated in the inductor 120 and is delivered to an output end, thus increasing the output voltage Vo, that is, the voltage across the capacitor 140.

For example, a second mode may be an operation mode when the first switch 110a is turned off and the second switch 110b is turned on, in which a closed circuit including the inductor 120 and the capacitor 140 may be formed. The current flowing in the inductor 120 flows through the closed circuit and is slowly dropped until the first switch 110a is turned on in a next period, such that the output voltage Vo may be dropped.

According to an exemplary embodiment of the inventive concept, the charging circuit 100 may be controlled by a controller 400a When the sensed output voltage Vo is low, the controller 400a may lengthen a conduction time of the first switch 110a and may shorten the conduction time of the second switch 110b, thus raising the output voltage Vo. When the sensed output voltage Vo is high, the controller 400a may shorten the conduction time of the first switch 110a and may lengthen the conduction time of the second switch 110b, thus dropping the output voltage Vo. For example, the controller 400a may adjust a duty ratio of a PWM signal output to each of the switches 110a and 110b according to the output voltage Vo, thus maintaining a voltage in a specific range in the capacitor 140. The controller 400a may be described in more detail with reference to FIG. 9.

Figure 4A:
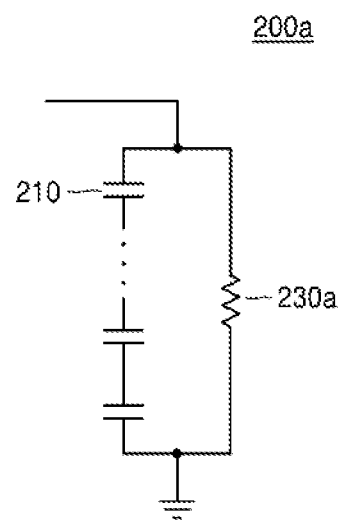
FIG. 4A is a schematic circuit diagram of a capacitor and an insulating resistor, which are serially connected with each other, of an auxiliary power device according to an exemplary embodiment of the inventive concept.
Figure 4B:
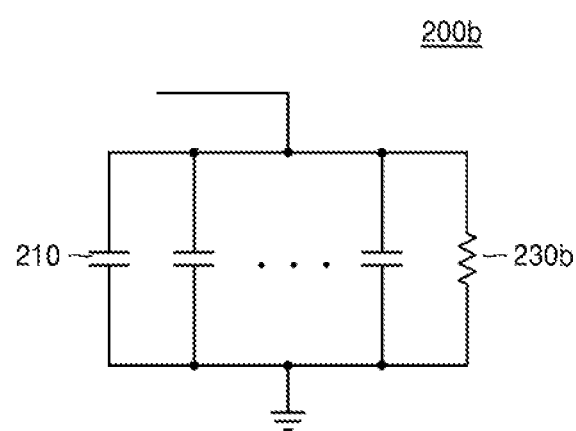
FIG. 4B is a schematic circuit diagram of a capacitor and an insulating resistor, which are connected with each other in parallel, of an auxiliary power device according to an exemplary embodiment of the inventive concept.

FIGS. 4A and 4B illustrate different structures of an auxiliary power device of a storage device including a path circuit of FIG. 1. To facilitate understanding, description may be made with reference to FIG. 1.

Referring to FIG. 4A, in the storage device 1000 including the path circuit according to an exemplary embodiment, an auxiliary power device 200a may be configured such that a plurality of capacitors 210 are connected in series. Generally, when the capacitors 210 are connected in series, a total voltage of the capacitors 210 may rise. Thus, by serially connecting small-volume capacitors, an auxiliary power device of a high voltage may be implemented. Meanwhile, by connecting the capacitors 210 in parallel, a total capacity of the capacitors 210 may increase, thus increasing a quantity of electric charge that may be stored therein.

Due to the physical properties of the capacitor 210, an insulating resistor may be in each of the plurality of capacitors 210. For the respective plurality of capacitors 210, the insulating resistor may be in parallel with the capacitor and thus function as a path through which the leakage current flows. Referring to FIG. 4A, a plurality of insulating resistors respectively generated in the plurality of capacitors 210 may be expressed as one equivalent insulating resistor 230a.

The leakage current generated in the capacitors 210 included in the auxiliary power device 200a may flow through the equivalent insulating resistor 230a. Referring to FIGS. 4A and 1, the equivalent insulating resistor 230a may be expressed as the first path.

Referring now to FIG. 4B, in the storage device 1000 including the path circuit according to an exemplary embodiment, an auxiliary power device 200b may be configured such that a plurality of capacitors 210 are connected in parallel. The plurality of parallel capacitors 210 may increase a charge volume of the auxiliary power device 200b. As described above, due to the physical properties of the capacitors 210, an insulating resistor may be in each of the plurality of capacitors 210. For the respective plurality of capacitors 210, the insulating resistor may be in parallel with the capacitor and thus function as a path through which the leakage current flows. Referring to FIG. 4B, a plurality of insulating resistors respectively generated in the plurality of capacitors 210 may be expressed as one equivalent insulating resistor 230b. For example, one equivalent insulating resistance value may be proportional to a harmonic mean of insulating resistance values of the plurality of capacitors 210.

The leakage current generated in the capacitor 210 included in the auxiliary power device 200b may flow through the equivalent insulating resistor 230b. Referring to FIGS. 4B and 1, the equivalent insulating resistor 230b may be expressed as the first path.

Although not shown, in the storage device 1000 including the path circuit according to an exemplary embodiment, an auxiliary power device 200b may be configured such that a plurality of capacitors 210 are connected in parallel and serially in combination. As described above, the total voltage of the capacitors may be raised by serially connecting the capacitors, and the total capacity of the capacitors may be increased by connecting the capacitors in parallel. In the storage device 1000 including the path circuit 310 according to an exemplary embodiment of the inventive concept, by connecting the plurality of capacitors 210 in combination of in series and in parallel, the total voltage and the total capacity of the capacitors may be increased.

Figure 5A:
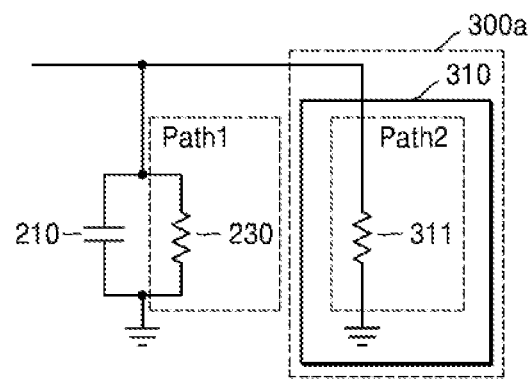
FIG. 5A is a schematic circuit diagram of a first path of an auxiliary power device and a second path of a state determining circuit including a resistor, according to an exemplary embodiment of the inventive concept.
Figure 5B:
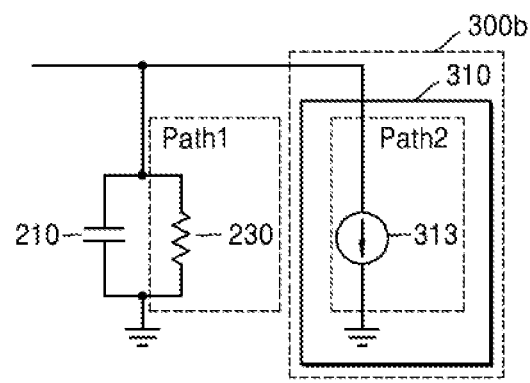
FIG. 5B is a schematic circuit diagram of a first path of an auxiliary power device and a second path of a state determining circuit including a current source, according to an exemplary embodiment of the inventive concept.
Figure 5C:
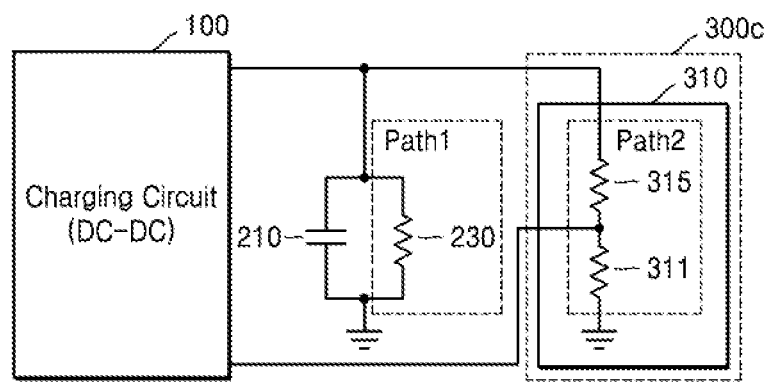
FIG. 5C is a schematic circuit diagram of a first path of an auxiliary power device and a second path of a state determining circuit including a voltage distributor, according to an exemplary embodiment of the inventive concept.

FIGS. 5A, 5B, and 5C illustrate the first path of the auxiliary power device 200 and the second path of the path circuit 310, according to an exemplary embodiment of the inventive concept. The first path Path1 and the second path Path2 may be paths through which leakage current generated by the physical properties of the capacitor 210 flows. The second path of the path circuit 310 may include a resistor. The first path and the second path are connected in parallel, such that upon application of a voltage from the charging circuit 100 to a common node on upper parts of the first path and the second path, the leakage current of the capacitor 210 may flow through the first path and the second path.

In FIG. 5A, the first path of an auxiliary power device 300a and the second path of the path circuit 310 are illustrated as connected according to an exemplary embodiment of the inventive concept. A value of current flowing through the second path may be greater than that of current flowing through the first path. That is, a value of a resistor 311 included in the second path may be less than a value of the insulating resistor 230 included in the first path. For example, a value of current flowing in the second path may be 1 mA and a value of current flowing in the first path may be 10 µA, such that the value of the current flowing in the first path may be a rate of 1% with respect to the value of the current flowing in the second path. However, this is merely an example of numerical values for describing an exemplary embodiment of the inventive concept, without being limited thereto.

Referring to FIG. 5A, by including the resistor 311 in the second path of the path circuit 310, leakage current flowing in the capacitor may be adjusted. A value of the leakage current of the capacitor may vary with the lifetime of the capacitor and the temperature and the humidity of the use environment, where the leakage current flowing through the capacitor flows in a split manner through the path circuit 310, thereby suppressing variation of the leakage current flowing in the first path, which may be a cause for interference with measurement of a voltage of an auxiliary power device. In other words, while maintaining a total amount of discharging current of the capacitor substantially constant, variation of the leakage current flowing through the first path is maintained not too high in spite of a change in the properties of the capacitor, thus improving the accuracy of measurement of a fault of the capacitor.

Although not indicated, the resistor 311 shown in FIG. 5A may be a variable resistor. The variable resistor may be flexibly adjusted corresponding to variation of the capacitor 210, such that the values of the current flowing in the first and second paths may be adjusted variably. The variable resistor may be adjusted towards 0 based on measurement or control needs.

Referring to FIG. 5B, a first path Path1 of an auxiliary power device and the second path Path2 of the path circuit 310 of the state determining circuit 300b are illustrated according to an exemplary embodiment of the inventive concept. The second path of the path circuit 310 may include a current source 313. In other words, a value of current flowing through the second path may be greater than that of current flowing through the first path. The current source may be variably set or preset according to the insulating resistor 230 included in the first path. For example, the value of the current flowing through the first path may be 10 µA, and a substantially constant value of current that is preset to flow through the current source 313 may be 1 mA. That is, the current source 313 may be pre-configured for a value of current flowing through the second path that is 100 times greater than the value of the current flowing through the first path. However, this example is merely a numerical value for describing an exemplary embodiment of the inventive concept, without being limited thereto.

As described with reference to FIG. 5B, the current source 313 included in the second path may suppress variation in the leakage current flowing in the first path, which may be a cause for interference with measurement of a voltage of an auxiliary power device.

Referring to FIG. 5C, a first path Path1 of an auxiliary power device and the second path Path2 of the path circuit 310 of the state determining circuit 300c are illustrated according to an exemplary embodiment of the inventive concept. The second path may include a voltage distributor.

Referring to FIG. 5C, the voltage distributor may be a first resistor 315 and a second resistor 311 connected in series, and a circuit that feeds a voltage applied to a node between the first and second resistors, where the second resistor is connected to ground and the first resistor is connected back to a charging circuit to maintain a voltage applied to the capacitor 210 substantially constant. That is, the voltage distributor 315 may function as a circuit for providing feedback as a voltage regulator.

As the voltage applied to the node to which the first resistor 315 and the second resistor 311 of the voltage distributor are connected is fed back to the charging circuit 100, the voltage applied to the capacitor 210 may be maintained substantially constant. That is, even when an input resistance generated by the charging circuit 100 vary or leakage current properties of the capacitor 210 change due to the voltage distributor 315, the voltage applied to the capacitor may be maintained substantially constant.

Referring to FIGS. 1, 2, and 5C, when a capacitor-applied voltage Vo is maintained substantially constant in spite of a change in an external environment, the capacitor-applied voltage Vo measured by the state determining circuit 300 may be an accurate value, such that a fault of the capacitor 210 may be accurately identified.

Although not shown, there may be a plurality of paths through which leakage current flows in addition to the second path through which the leakage current flows. For example, there may be a third path connected in parallel to the second path, and the third path may include a resistor, a current source, and a voltage distributor described with reference to FIGS. 5A through 5C as a passage through which the leakage current flows.

Figure 6:
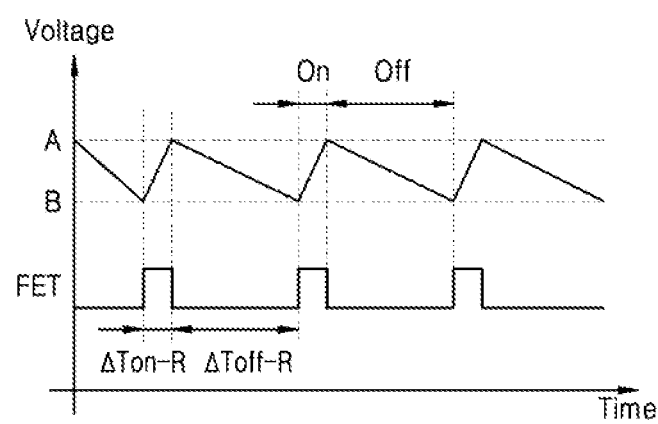
FIG. 6 is a schematic graphical diagram illustrating a voltage of an auxiliary power device and switching of a charging circuit over time in a normal state of the auxiliary power device, according to an exemplary embodiment of the inventive concept.

FIG. 6 illustrates a voltage of an auxiliary power device and switching of a charging circuit over time in a normal state of the auxiliary power device, according to an exemplary embodiment of the inventive concept. The x axis indicates time and the y axis indicates voltage, in which a unit may be an arbitrary unit. A on the y axis may indicate a first voltage of the auxiliary power device 200 when charging is completed by the charging circuit 100, that is, discharge starts, and B may indicate a second voltage of the auxiliary power device 200 when charging by the charging circuit 100 starts. To facilitate understanding, description may be made with reference to FIG. 1.

Referring to FIG. 6, in the storage device 1000 including the path circuit 310 according to an exemplary embodiment of the inventive concept, the state determining circuit 300 may measure an output voltage of the charging circuit 310 or the voltage of the auxiliary power device 200. More specifically, the state determining circuit 300 may detect a first voltage A when discharge of the capacitor 210 starts, and a second voltage B when charging starts.

The charging circuit 100 may automatically perform a charging operation according to a voltage level of the auxiliary power device 200. In other words, the charging circuit 100 may perform the charging operation with respect to the auxiliary power device 200 based on a preset voltage condition. For example, when a first voltage of the auxiliary power device 200 is set to a discharge start voltage, a second voltage of the auxiliary power device 200 is set to a charge start voltage, and when the voltage of the auxiliary power device 200 may reach the second voltage due to natural discharge thereof, then the charging circuit 100 may start the charging operation with respect to the auxiliary power device 200. Thereafter, when the voltage of the auxiliary power device 200 reaches the first voltage that is the discharge start voltage and a charge complete voltage, then the charging circuit 100 may end the charging operation. The charging operation of the charging circuit 100 may be periodically and repeatedly performed between the first voltage and the second voltage in the normal state of the auxiliary power device 200.

When the state determining circuit 300 detects the first voltage and the second voltage of the auxiliary power device 200, a timer (not shown) may measure a time of a charge period and/or a time of a discharge period of the charging circuit 100. More specifically, the discharge period is a period in which the voltage of the auxiliary power device 200 drops from the first voltage to the second voltage, and thus may correspond to an off period of an FET (110 of FIG. 2) of the DC-DC converter of the charging circuit 100 or a switch-on state of the switching circuit. More specifically, the charge period is a period in which the voltage of the auxiliary power device 200 rises from the second voltage to the first voltage, and thus may correspond to an on period of the FET (110 of FIG. 2) of the DC-DC converter of the charging circuit 100 or a switch-off state of the switching circuit.

Once a time of the on period and/or the off period of the FET is measured by the timer (not shown), the state determining circuit 300 may determine whether the state of the auxiliary power device 200 is normal. In other words, when the state of the auxiliary power device 200 is normal, the charging operation of the charging circuit 100 may be periodically and repeatedly performed between the first voltage and the second voltage. Thus, the time of the on period of the FET corresponding to the charge period and the time of the off period of the FET corresponding to the discharge period may have specific values, respectively. As a result, the time of the on period of the FET and/or the time of the off period of the FET may be measured and set to reference times, respectively, and a measured time of the on period of the FET and/or a measured time of the off period of the FET may be compared with the reference times, thereby determining whether the state of the auxiliary power device 200 is normal or not. The reference time may be input in advance without a separate initialization or setting process.

The state determining circuit 300 may compare the measured time of the on period of the FET and/or the measured time of the off period of the FET with the reference time or times, such that when a difference between the measured time and the reference time is less than or equal to a preset range, the state determining circuit 300 may determine the state of the auxiliary power device 200 to be normal; when the difference exceeds the preset range, the state determining circuit 300 may determine the state of the auxiliary power device 200 to be abnormal.

Referring to FIG. 6, when the state of the auxiliary power device 200 is normal, the time of the on period of the FET may correspond to an on-reference time ΔTon-R and the time of the off period of the FET may correspond to an off-reference time ΔToff-R. The on-reference time ΔTon-R and the off-reference time ΔToff-R may be maintained substantially constant for each period.

In other words, when the state of the auxiliary power device 200 is not determined, if the time of the on period and/or the time of the off period of the FET of the charging circuit 100, measured through the state determining circuit 300, are substantially the same as the on-reference time ΔTon-R and the off-reference time ΔToff-R, the auxiliary power device 200 may be determined to be in the normal state. For example, a set range for the difference between the measured time and the on/off-reference time may be ±5%. However, the set range is not limited to the above numerical value.

The on-reference time for the on period of the FET and the off-reference time for the off period of the FET may both be respectively set, or any one of them may be set. Determination made by the state determining circuit 300 of whether the state of the auxiliary power device 200 is normal may include comparing a measured time of the on period of the FET with the on-reference time or comparing a measured time of the off period of the FET with the off-reference time. Alternatively, the determination may include both comparing a measured time of the on period of the FET with the on-reference time and comparing a measured time of the off period of the FET with the off-reference time.

Figure 7A:
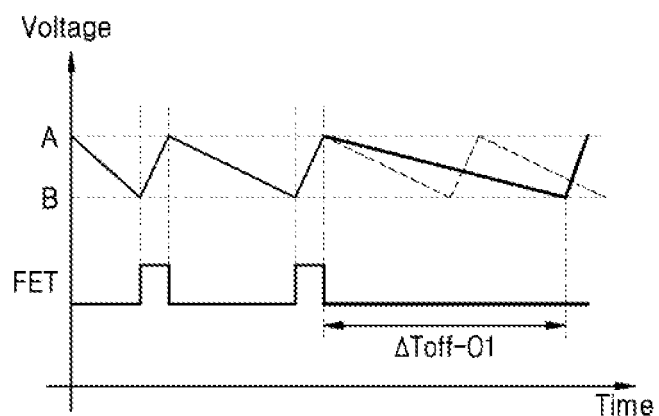
FIGS. 7A through 7C are schematic graphical diagrams illustrating a voltage of an auxiliary power device and switching of a charging circuit over time in an abnormal state of the auxiliary power device, according to an exemplary embodiment of the inventive concept.
Figure 7B:
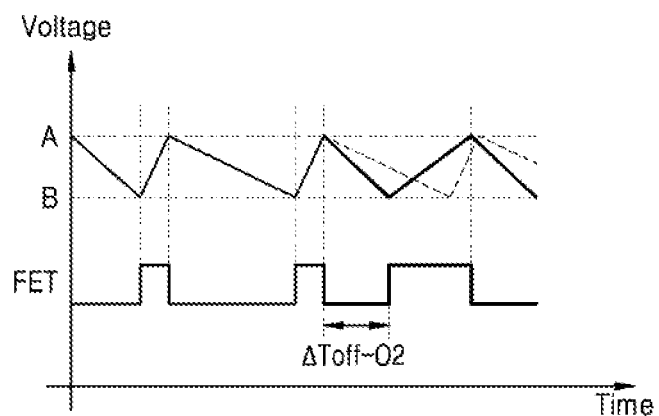
Figure 7C:
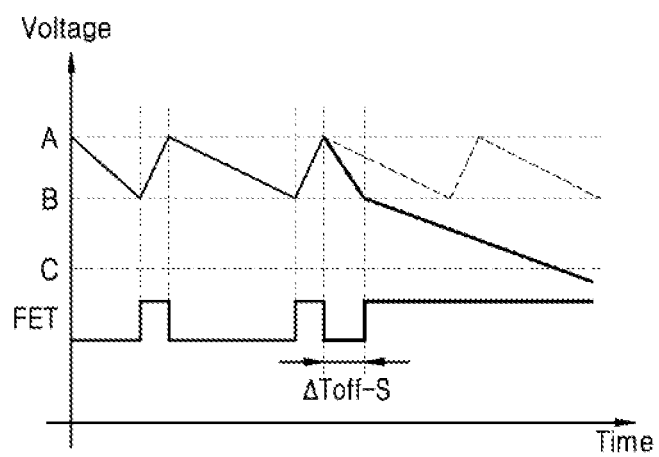

FIGS. 7A through 7C illustrate a voltage of an auxiliary power device and switching of a charging circuit over time in an abnormal state of the auxiliary power device, according to an exemplary embodiment of the inventive concept. FIGS. 7A and 7B illustrate an electrical open state of the capacitor 210, and FIG. 7C illustrates an electrical short state of the capacitor 210.

Referring to FIG. 7A, when the state of the auxiliary power device 200 is abnormal, a voltage of the auxiliary power device 200 may deviate from a periodic rise and drop pattern or cycle between a first voltage A and a second voltage B. For example, when an open fault occurs in some of the capacitors 210 of the auxiliary power device 200 at a point in time when a solid straight line starts in FIG. 5B, a natural discharge may slow down or quicken depending on a surrounding environment, FIG. 7A shows an example where the natural discharge slows down. For reference, when the natural discharge slows down due to the open fault of the capacitors 210, the time of the charge period may be shortened. However, a time relationship between discharge and charge is not limited thereto.

When the natural discharge slows down, the time during which the auxiliary power device 200 drops to the second voltage B, i.e., the off period of the FET may be lengthened. Thus, the state determining circuit 300 may measure the time of the off period of the FET as a first open off time ΔToff-O1. The first open off time ΔToff-O1 may be different from the off-reference time ΔToff-R. For example, when the set range for the difference is 5%, the first open off time ΔToff-O1 may be lengthened exceeding the off-reference time ΔToff-R by at least 5%. Thus, the state determining circuit 300 may determine the auxiliary power device 200 to be in an abnormal state, such as the open state.

FIG. 7B illustrates a case where the auxiliary power device 200 is in an abnormal state, and the open fault occurs in some of the capacitors 210. However, FIG. 7B shows a case where the natural discharge quickens unlike in FIG. 7A.

According to an exemplary embodiment of the inventive concept, when the natural discharge quickens, the time during which the auxiliary power device 200 drops to the second voltage B, i.e., the off period of the FET, may be shortened. Thus, the state determining circuit 300 may measure the time of the off period of the FET as a second open off time ΔToff-O2. The second open off time ΔToff-O2 may be different from the off-reference time ΔToff-R. For example, when the set range for the difference is 5%, the second open off time ΔToff-O2 may be shortened exceeding the off-reference time ΔToff-R by 5%. Thus, a state determining circuit 300 may determine the auxiliary power device 200 to be in an abnormal state, such as the open state.

FIG. 7C illustrates a case where the auxiliary power device 200 is in an abnormal state, and the short fault occurs in some of the capacitors 210. When the short fault occurs in a capacitor 210, the electric charges may flow out without being accumulated in the capacitor 210, such that the voltage of the capacitor 210 may gradually drop to a final ground state. As shown in FIG. 4B, when the auxiliary power device 200 includes the capacitors 210 connected in parallel, upon occurrence of a short fault in any capacitor 210, the other capacitors are affected, such that the total voltage of the auxiliary power device 200 may drop down to the ground state.

In view of the on period and the off period of the FET, the short fault of the capacitor 210 may be described as below. For example, in FIG. 7C, when a short fault occurs in the capacitor 210 at a point at which a solid straight line starts, a discharge may rapidly progress through the short path. Thus, the off period of the FET may be significantly shortened, such that the state determining circuit 300 may measure the time of the off period of the FET as a short off time ΔToff-S. The short off time ΔToff-S may be different from the off-reference time ΔToff-R. For example, when the set range for the difference is 5%, the short off time ΔToff-S may be shortened to less than the off-reference time ΔToff-R by at least 5%. Thus, the state determining circuit 300 may determine the auxiliary power device 200 to be in an abnormal state.

According to an exemplary embodiment of the inventive concept, the short off time ΔToff-S may indicate a time during which the voltage drops from the second voltage A to the first voltage B.

In the normal state of the auxiliary power device 200, at a moment when the voltage of the auxiliary power device 200 reaches the second voltage B, the charging operation of the charging circuit 100 is resumed. However, when the auxiliary power device 200 is in an abnormal state such as the short state, the voltage of the auxiliary power device 200 may continuously drop in spite of the charging operation of the charging circuit 100. Thus, the charging operation of the charging circuit 100 may be continuously maintained, and the on-period of the FET may be continuously maintained.

Even when the state of the auxiliary power device 200 is determined to be abnormal by the state determining circuit 300, it might be difficult to know which one of the open fault or the short fault is occurring in a capacitor 210 of the auxiliary power device 200. This is because even in the case of the open fault of the capacitor 210 as shown in FIG. 7B, the second open off time ΔToff-O2 may be shorter than the reference off time ΔToff-R. However, when the first open off time ΔToff-O1 is longer than the reference off time ΔToff-R as in case of the open fault of the capacitor 210 in FIG. 7A, it may be determined that an open fault is occurring in the capacitor 210.

When the short fault is occurring in the capacitor 210, the voltage of the auxiliary power device 200 may continuously drop through the first voltage B as shown in FIG. 7C. Thus, when a third voltage C lower than the first voltage B is set and the state determining circuit 300 detects the voltage of the auxiliary power device 200 corresponding to the third voltage C, then it may be determined that the short fault is occurring in the capacitor 210 of the auxiliary power device 200. That is, by adding a detection mechanism of the third voltage C, the open fault of the capacitor 210 in FIG. 7B and the short fault of the capacitor 210 in FIG. 5D may be distinguished from each other.

Referring to FIGS. 3 and 7A through 7C, upon occurrence of a fault in the auxiliary power device 200, detailed information about a type of the fault is processed by a controller 400, so the charging circuit 100 may be efficiently controlled through the controller 400. For example, when an open fault occurs in the capacitor 210, the controller 400 may control the auxiliary power device 200 to be maintained in the normal state by regulating a switching period of the FET or an input voltage. In addition, when a short fault occurs in the capacitor 210, the controller 400 may stop the charging operation of the charging circuit 100, thus preventing unnecessary power consumption. Moreover, the fault state of the capacitor 210 may be delivered to the user through an alert message or an alert signal, allowing repair or replacement work to be promptly performed with respect to the auxiliary power device 200.

Referring to FIGS. 1 and 7A through 7C, the storage device 1000 including the path circuit 310 may determine the fault of the capacitor in real time by measuring the voltage of the auxiliary power device 200 and comparing a charge period or a discharge period with a reference time. The path circuit 310 may provide a path through which leakage current generated by the insulating resistor 230, existing due to the physical properties of the capacitor 210, flows in a split manner. Thus, the state determining circuit 300 may suppress an influence of the leakage current in measurement of the voltage of the capacitor 210, and continue precisely measuring the voltage of the capacitor 210. When the influence of the leakage current is suppressed, the accuracy of determination with respect to a total capacitance of the capacitor in the normal state may be improved, such that determination of whether the auxiliary power device 200 is operating in a normal state may be performed with increased precision.

Figure 8A:
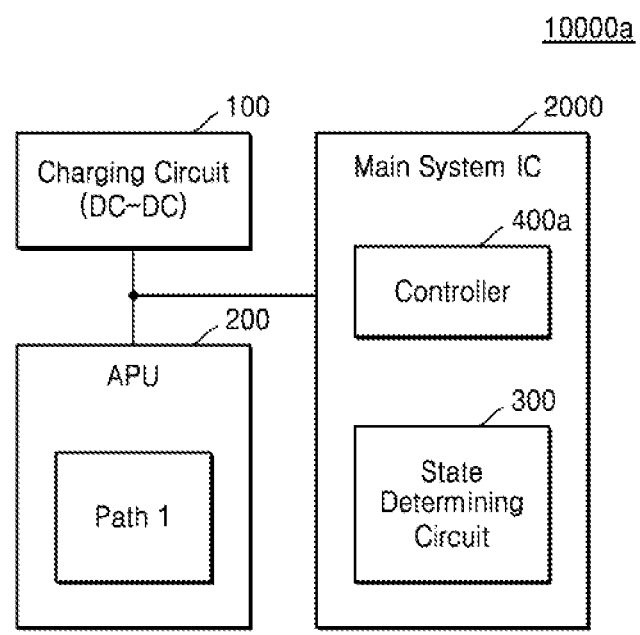
FIG. 8A is a schematic block diagram of a memory system in which a state determining circuit is included in a main system integrated circuit (IC), according to an exemplary embodiment of the inventive concept.

FIG. 8A illustrates a memory system 10000a in which a state determining circuit 300 is included in a main system IC 2000, according to an exemplary embodiment of the inventive concept. Referring to FIG. 8A, the state determining circuit 300 may be mounted in a separate IC from the charging circuit 100. When the state determining circuit 300 is outside the charging circuit 100 and the auxiliary power device or auxiliary power unit (APU) 200, a voltage applied by the charging circuit 100 or a voltage signal of the capacitor 210, measured in the APU 200, may be transmitted to the main system IC 2000, and the state determining circuit 300 included in the main system IC 2000 may determine in real time whether the APU 200 is operating in a normal state. Although not specifically shown, the charging circuit 100 and the APU 200 may be arranged in an IC or block that is different from the main system IC 2000.

Referring to FIGS. 3 and 8A, the main system IC 2000 may include a controller 400a. As the state determining circuit 300 is arranged in the main system IC 2000, the state of the auxiliary power device 200 may be monitored and information about the state of the auxiliary power device 200 may be delivered directly to the controller 400a. Thus, control of the charging circuit 100, performed by the controller 400a, may be performed rapidly.

More specifically, when the state determining circuit 300 determines that the voltage Vo of the capacitor 210 is low, the controller 400a may lengthen a conduction time of the first switch 110a and shorten a conduction time of the second switch 110b, thus raising the output voltage Vo. When the state determining circuit 300 determines that the voltage Vo of the capacitor 210 is high, the controller 400a may shorten the conduction time of the first switch 110a and lengthen the conduction time of the second switch 110b, thus dropping the output voltage Vo, as described above.

Figure 8B:
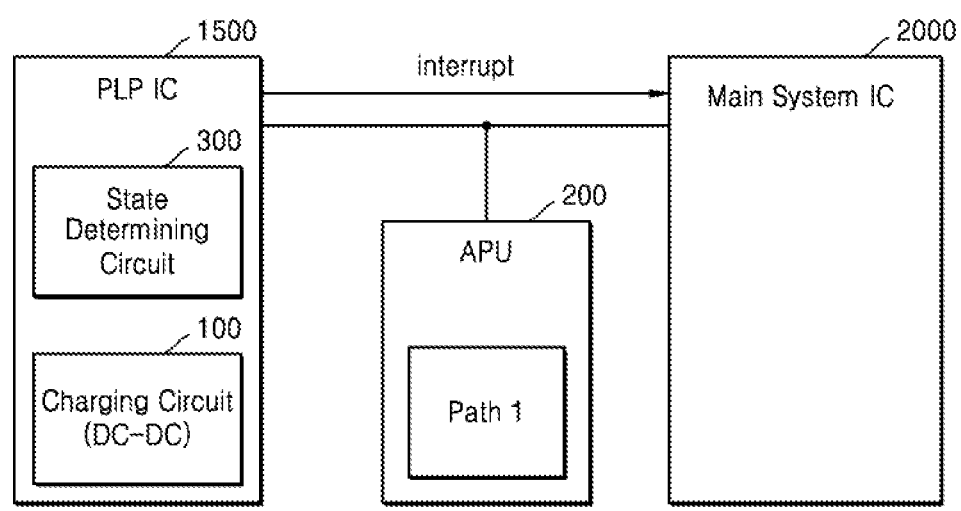
FIG. 8B is a schematic block diagram of a memory system in which a state determining circuit is included in a power loss protection (PLP) IC, according to an exemplary embodiment of the inventive concept.

FIG. 8B illustrates a memory system 10000b in which a state determining circuit is included in a power loss protection (PLP) IC 1500 according to an exemplary embodiment of the inventive concept. Referring to FIG. 8B, the state determining circuit 300 may be mounted in the PLP IC 1500 in which the charging circuit 100 is also mounted. The PLP IC 1500 may prevent power loss. When the state determining circuit 300 is inside the charging circuit 100 and directly connected to the auxiliary power device 200, the voltage applied to the charging circuit 100 or the voltage signal of the capacitor 210, measured in the auxiliary power device 200, may be transmitted to the state determining circuit 300 without passing through a separate interface, and the state determining circuit 300 included in the PLP IC 1500 may determine in real time whether the auxiliary power device 200 is normal. In an alternate embodiment, the APU 200 may also be mounted in the PLP IC 1500.

Referring to FIG. 8B, the PLP IC 1500 may deliver the determination made by the state determining circuit 300 of whether the auxiliary power device 200 is or is not operating in a normal state to the main system IC 2000, in an interrupt manner. An interrupt signal may deliver the normal, open, and/or short states to the main system IC 2000 according to the state of the auxiliary power device 200.

Figure 9A:
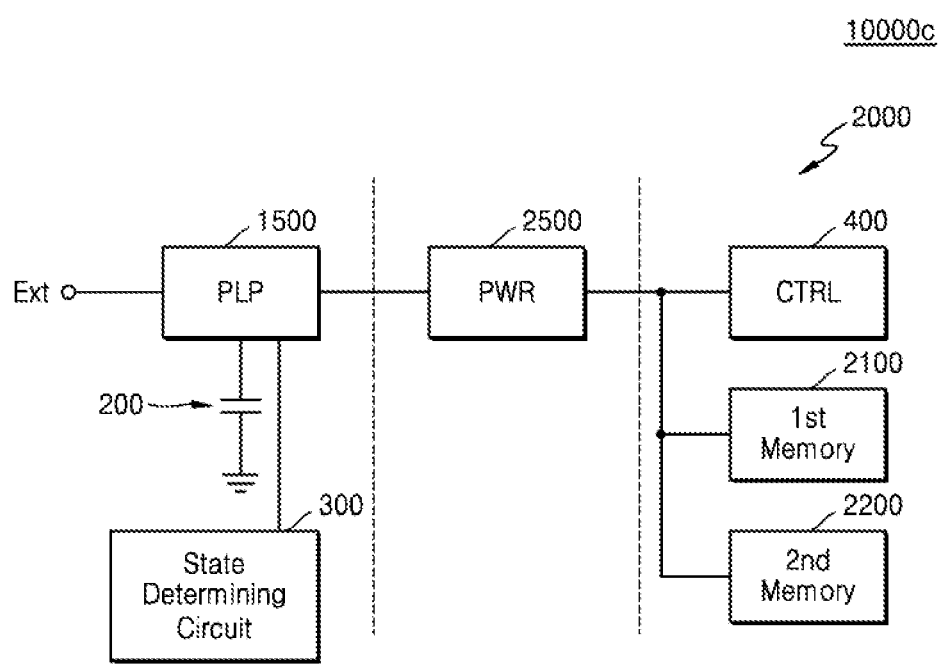
FIG. 9A is a schematic block diagram of a memory system in which a state determining circuit is included in a PLP block, according to an exemplary embodiment of the inventive concept.
Figure 9B:
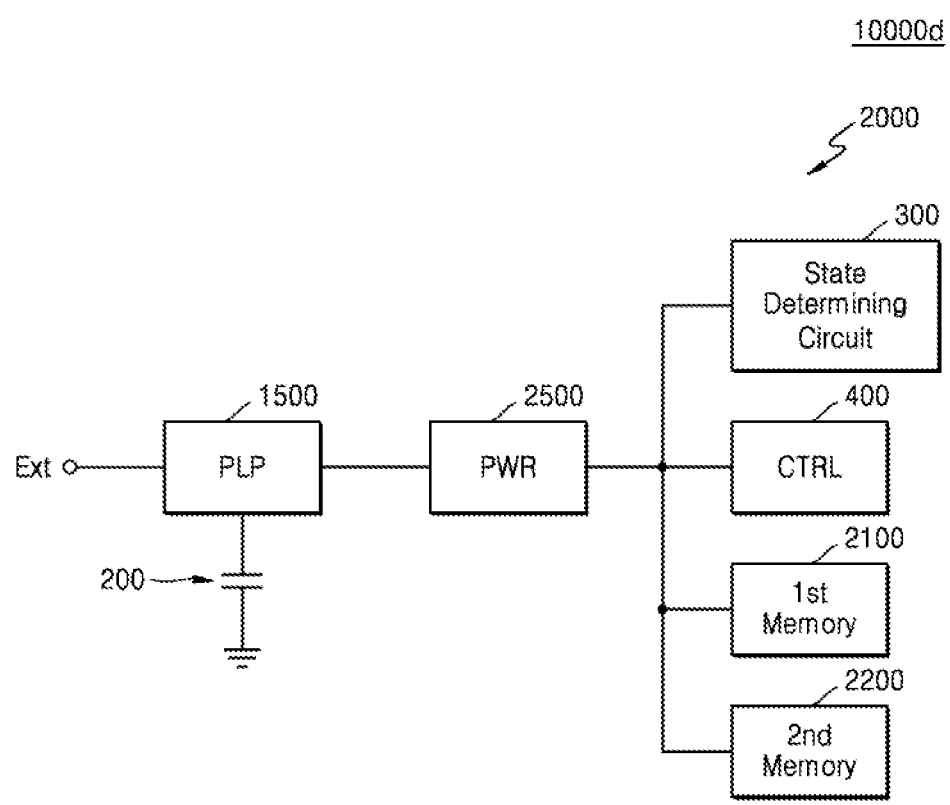
FIG. 9B is a schematic block diagram of a memory system in which a state determining circuit is included in a main system IC, according to an exemplary embodiment of the inventive concept.

FIG. 9A illustrates a memory system in which a state determining circuit is included in or connected directly with a PLP IC, according to an exemplary embodiment of the inventive concept, and FIG. 9B illustrates a memory system in which a state determining circuit is included in or connected directly with a main system IC, according to an exemplary embodiment of the inventive concept.

Referring to FIGS. 9A and 9B, a memory system 10000c or 10000d may include a PLP IC 1500, a power block 2500, and a main system IC 2000.

The PLP IC 1500 may prevent power loss supplied to the main system IC 2000. For example, the PLP IC 1500 may include the charging circuit 100 and the auxiliary power device 200.

The power block 2500 may supply power supplied through the PLP IC 1500 to the main system IC 2000. The power block 2500 may correspond to power input/output terminals of the main system IC 2000.

The main system IC 2000 may include the controller 400, a first memory chip 2100, and a second memory chip 2200.

Any one of the first memory chip 2100 and the second memory chip 2200 may be a cache memory, and the other may be a main memory.

The controller 400 may control the charging circuit 100 of the PLP 1500. More specifically, when a fault occurs in the auxiliary power device 200, the controller 400 may change a charging condition for the charging circuit 100 to maintain the auxiliary power device 200 in a normal state when possible. Upon occurrence of the fault in the auxiliary power device 200, the controller 400 may change a memory write operation mode in an electronic system to which power is supplied, such as a memory system, to store data in the main memory in real time.

Moreover, upon occurrence of the fault in the auxiliary power device 200, the controller 400 may generate an alert signal or the like, and provide the same to the user and/or higher-level system, thus allowing the user or system to perform repair or replacement work with respect to the auxiliary power device 200.

A chip corresponding to the main memory may have a multi-stacked structure. Depending on a type of the main memory, the memory system 10000 may correspond to any one of a solid-state drive (SSD) module, a dynamic random-access memory (DRAM) module, and a flash memory module. In case of the SSD module, DRAM may be used as a cache memory and a NAND may be used as a main memory.

In the memory system 10000 including the storage device 1000 of FIG. 1 having a path circuit according to an exemplary embodiment of the inventive concept, the auxiliary power device may be adopted in an electronic device using relatively high backup energy, such as the memory module. Thus, in the auxiliary power device, a plurality of capacitors may be connected in parallel and have high capacitor capacity. For example, the auxiliary power device may have high capacitor capacity of several μF to several mF. More specifically, the auxiliary power device may be used in an SSD module using backup energy of 10 mJ or more, such that the storage device 1000 including the path circuit according to an exemplary embodiment of the inventive concept may be included in the SSD module to monitor the auxiliary power device. The electronic device adopting the auxiliary power device is not limited to the SSD module.

Referring to FIG. 9A, the memory system 10000c according to an exemplary embodiment of the inventive concept may include the state determining circuit 300 in the PLP IC 1500. A voltage signal of the capacitor 210 may be immediately delivered to the state determining circuit 300 without passing through a separate interface, indicated her by dashed lines, and the determination made by the state determining circuit 300 of whether the auxiliary power device 200 is operating in a normal state may be delivered to the main system IC 2000 in an interrupt manner, as described with reference to FIG. 8B.

Referring to FIG. 9B, the memory system 10000d according to an exemplary embodiment of the inventive concept may include the state determining circuit 300 in the main system IC 1500. The state determining circuit 300 may be arranged in the main system IC 2000, thus monitoring the state of the auxiliary power device 200 and delivering information about the state of the auxiliary power device 200 directly to the controller 400, such that the charging circuit 100 may be promptly controlled by the controller 400, as described above with reference to FIG. 8A.

Figure 10A:
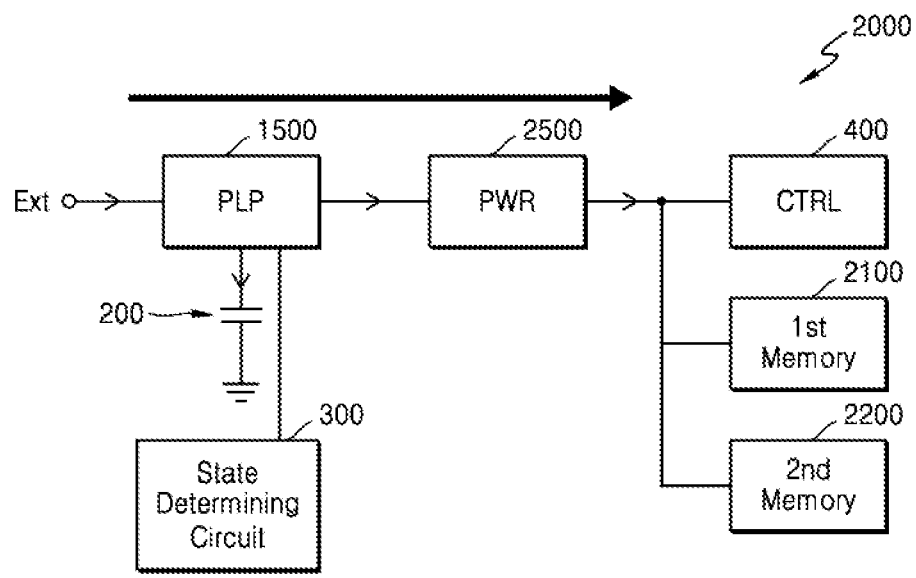
FIGS. 10A and 10B are schematic hybrid conceptual diagrams showing a power supply process in a memory system according to an exemplary embodiment of the inventive concept.
Figure 10B:
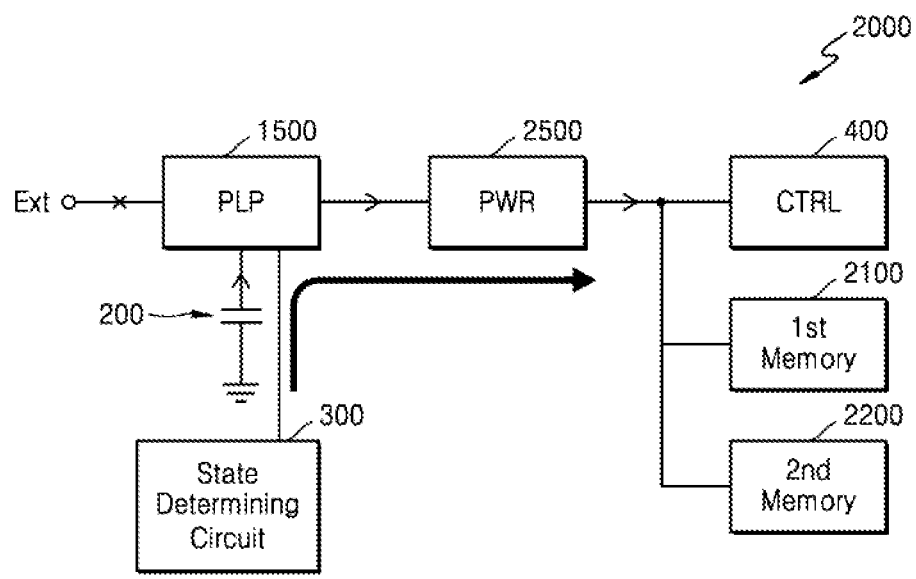

FIGS. 10A and 10B illustrate a power supply process in a memory system according to an exemplary embodiment of the inventive concept. While the state determining circuit 300 is illustrated as being directly connected to or included in the PLP IC 1500 in FIGS. 10A and 10B for convenience of description, the state determining circuit 300 may also be included in the main system IC 2000 without being limited to the example.

Referring to FIGS. 10A and 10B, when an external power source Ext is sufficient, as indicated by a bold arrow in FIG. 10A, power from the external power source Ext may be supplied to the main system IC 2000 through the PLP IC 1500 and the power block 2500. The power from the external power source Ext may be supplied to the charging circuit 100 in the PLP IC 1500, such that periodic and repetitive charging operations may be performed by the charging circuit 100 with respect to the auxiliary power device 200.

Upon occurrence of a SPO situation, potentially due to abnormality or malfunction of the external power source Ext, power from the auxiliary power device 200 may be supplied to the main system IC 2000 through the PLP IC 1500 and the power block 2500 as indicated by a bold arrow in FIG. 10B. Thus, the main system IC 2000 may continue operating during the critical time beginning with the SPO by using the power of the auxiliary power device 200, thereby preventing data loss.

Figure 11:
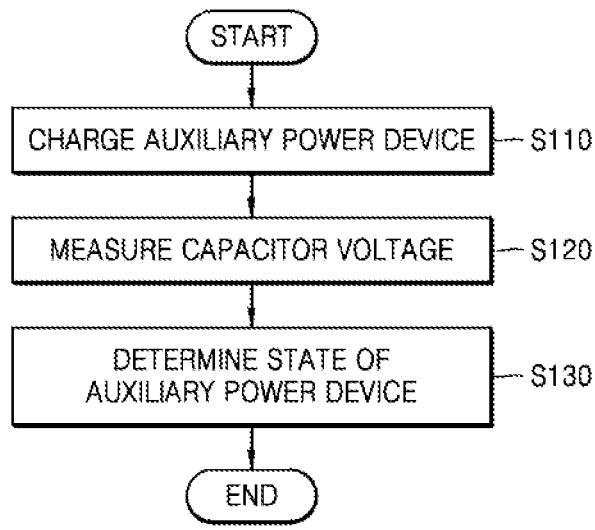
FIGS. 11 through 13 are flowchart diagrams illustrating an operation method of a storage device that determines a state of an auxiliary power device, according to an exemplary embodiment of the inventive concept.
Figure 12:
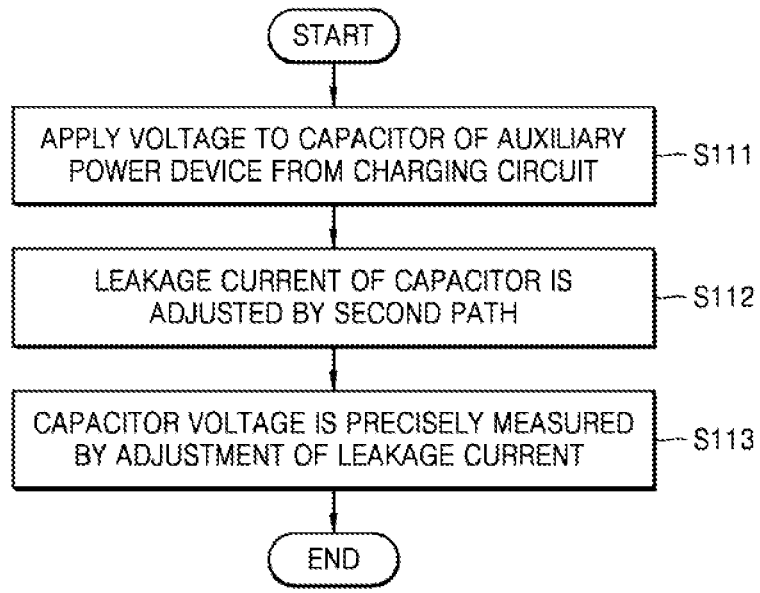
Figure 13:
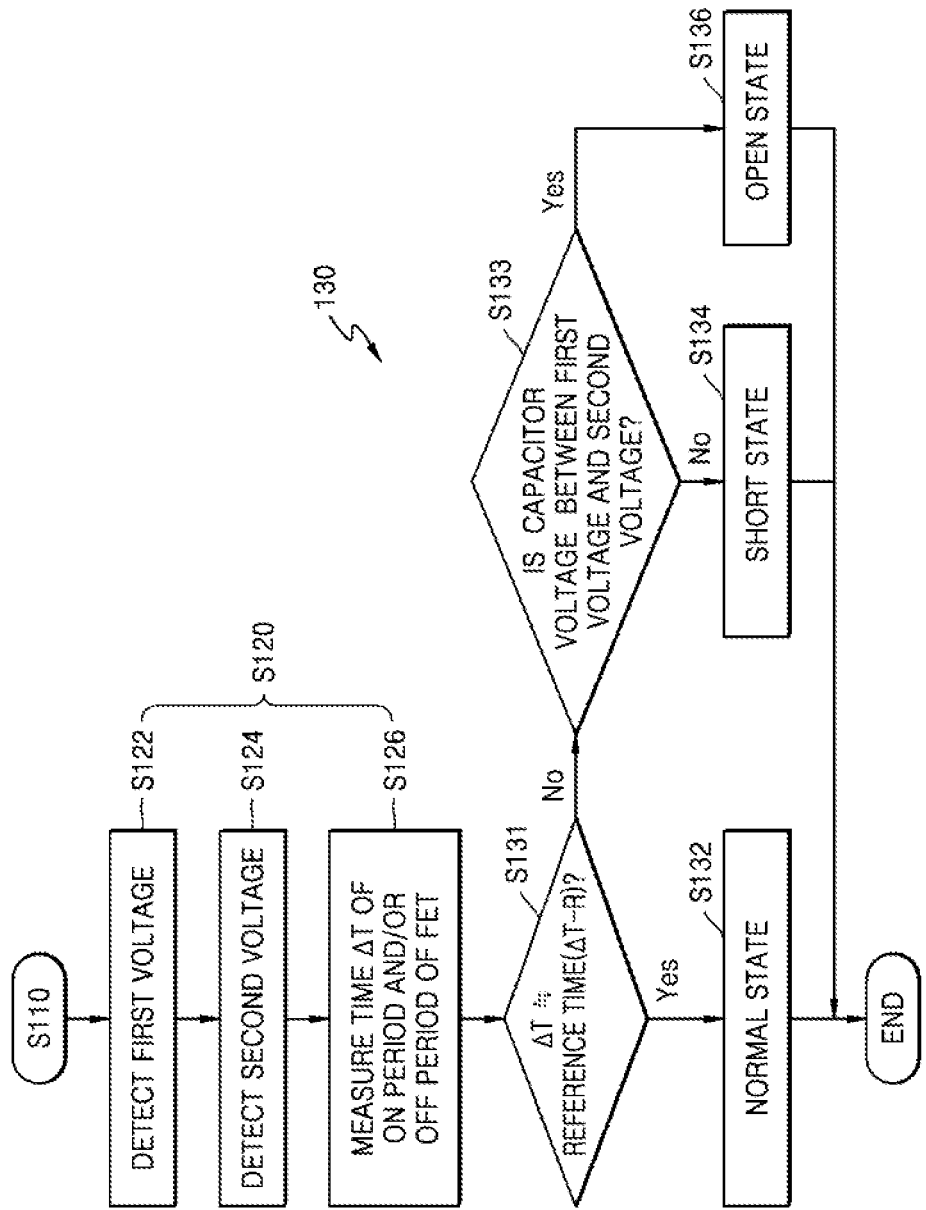

FIGS. 11 through 13 illustrate operation of a storage device that determines a state of an auxiliary power device, according to an exemplary embodiment of the inventive concept.

Referring to FIGS. 1 and 11, an operation method of the storage device 1000 for determining the state of the auxiliary power device 200 is expressed as a flowchart.

When the charging circuit 100 supplies power, the auxiliary power device is charged in operation S110. Thereafter, when charging/discharging of the auxiliary power device 200 is performed, the state determining circuit 300 measures a capacitor voltage in operation S120. The state determining circuit 300 may measure the first voltage A and the second voltage B, and determine whether the auxiliary power device 200 is operating in a normal state based on on/off of the switching circuit, in operation S130.

Referring to FIGS. 1 and 12, in the operation method of the storage device 1000 for determining the state of the auxiliary power device 200, the charging operation S110 of the auxiliary power device 200 and capacitor measurement operation S120 are illustrated in greater detail.

In charging operation S111, the charging circuit 100 may apply a voltage to the capacitor of the auxiliary power device 200. Thereafter in operation S112, a leakage current originating from the physical properties of the capacitor flows in a split manner through the second path of the state determining circuit 300, such that total leakage current of the capacitor is adjusted. In operation S113, as the leakage current of the capacitor is adjusted, the capacitor voltage may be precisely measured without being affected by the leakage current.

Referring to FIGS. 1, 6, 7A through 7C, and 13, an operation method of the storage device 1000 for determining the state of the auxiliary power device 200 is expressed in more detail with respect to the state of the capacitor.

After charging operation S110 of the auxiliary power device 200, the state determining circuit 300 may detect the first voltage A in operation S122. The state determining circuit 300 may detect the second voltage B in operation S124.

The state determining circuit 300 may measure a time of an on and/or off period of the FET in operation S126. The state determining circuit 300 may compare the measured time of the on/off period of the FET with a reference time, in operation S131.

When the measured time of the on/off period of the FET is within a preset error range, such as +/−5%, from the reference time, the state determining circuit 300 may determine that the auxiliary power device 200 is in the normal state, in operation S132. When the measured time of the on/off period of the FET is out of the preset error range from the reference time, the state determining circuit 300 may determine whether a capacitor voltage Vo is between the first voltage and the second voltage, in operation S133.

When the capacitor voltage Vo is not between the first voltage and the second voltage, the state determining circuit 300 may determine that the auxiliary power device 200 is in the short state, in operation S134. When the capacitor voltage Vo is between the first voltage and the second voltage, the state determining circuit 300 may determine that the auxiliary power device 200 is in the open state, in operation S136.

While the inventive concept has been particularly shown and described with reference to exemplary embodiments thereof, it shall be understood that various changes in form and details may be made therein by those of ordinary skill in the pertinent art without departing from the scope or spirit of the present disclosure as set forth in the following claims and their legal equivalents.

What is claimed is:

1. A storage device comprising:
an auxiliary power device including at least one capacitor, wherein the at least one capacitor has a first path for leakage current;
a charging circuit including a switch connected to the auxiliary power device; and
a state determining circuit connected to the auxiliary power device,
wherein the state determining circuit includes a path circuit connected in parallel with the at least one capacitor to form a second path having a resistance lower than a resistance of the first path,
wherein the state determining circuit is configured to determine an abnormal state as an open state if a time of an off period of the switch is shorter than a time of a preset first period when a voltage of the at least one capacitor aperiodically cycles between a first voltage level and a second voltage level.

2. The storage device of claim 1, wherein:
the charging circuit comprises a direct current (DC)-DC converter.

3. The storage device of claim 1, wherein the state determining circuit is further configured to:
measure the voltage of the at least one capacitor and determine a fault of the at least one capacitor by comparing a change time of the measured voltage with a reference time;
determine a state of the auxiliary power device to be in a normal state, when the voltage of the at least one capacitor periodically cycles between the first voltage level and the second voltage level that is lower than the first voltage level; and
determine the state of the auxiliary power device to be in the abnormal state, when the voltage of the at least one capacitor aperiodically cycles or deviates from between the first voltage level and the second voltage level.

4. The storage device of claim 3, wherein:
the state determining circuit is further configured to determine the abnormal state as a short state if the voltage of the at least one capacitor is measured as being lower than or equal to a third voltage level that is lower than the second voltage level.

5. The storage device of claim 1, wherein:
the path circuit comprises a resistor, and
a first current flowing through the first path is less than a second current flowing through the resistor.

6. The storage device of claim 1, wherein:
the second path comprises a variable resistor, and
the variable resistor is variably adjusted based on a change of resistance in an insulating resistor of the first path of the at least one capacitor.

7. The storage device of claim 1, wherein:
the path circuit comprises a first resistor and a second resistor that are connected in series to form the second path, and is configured to feed back a feedback voltage to the charging circuit through a node to which the first resistor and the second resistor are connected to maintain substantially constant a voltage applied to the at least one capacitor.

8. The storage device of claim 1, wherein:
the state determining circuit further comprises a third path for leakage current in addition to the first path and the second path.

9. The storage device of claim 1, wherein:
the auxiliary power device comprises a plurality of capacitors, and
each of the plurality of capacitors is connected to at least one other of the plurality of capacitors in at least one of a serial manner, a parallel manner, or a combination of the serial manner and the parallel manner.

10. The storage device of claim 1, wherein:
the auxiliary power device comprises a plurality of capacitors connected in parallel;
the charging circuit comprises at least one field effect transistor (FET) in the switch and a direct current (DC)-DC converter; and
the state determining circuit is configured to determine a state of the auxiliary power device by measuring a time of at least one of an off period of the at least one FET or an on period of the at least one FET and comparing the measured time with a reference time,
wherein the path circuit is connected in parallel with the plurality of capacitors to form the second path having a resistance value that is less than a resistance value of the first path.

11. The storage device of claim 1, wherein
the charging circuit is configured to apply a voltage to the at least one capacitor, and
the state determining circuit is configured to measure a voltage of a charge/discharge period of the at least one capacitor and determine a fault of the at least one capacitor by comparing a measured time of the charge/discharge period with a reference time.

12. A storage device comprising:
an auxiliary power device including at least one capacitor, wherein the at least one capacitor has a first path for leakage current;
a charging circuit including a switch connected to the auxiliary power device; and
a state determining circuit connected to the auxiliary power device,
wherein the state determining circuit includes a path circuit connected in parallel with the at leas one capacitor to form a second path having at least one of a resistance lower than a resistance of the first path or a current source, wherein the state determining circuit is configured to:
- determine a state of the auxiliary power device to be in a normal state if a voltage of the at least one capacitor periodically cycles between a first voltage level and a second voltage level that is lower than the first voltage level;
- determine the auxiliary power device to be in an open state if a time of an off period of the switch is shorter than a time of a preset first period, when the voltage of the at least one capacitor aperiodically cycles between the first voltage level and the second voltage level that is lower than the first voltage level; and
- determine the auxiliary power device to be in a short state if the voltage of the at least one capacitor is measured as being lower than or equal to a third voltage level that is lower than the second voltage level.

13. The storage device of claim 12, wherein:
the second path comprises at least one current source.

14. The storage device of claim 12,
wherein the path circuit is coupled to a current measurement circuit configured to measure voltages of the at least one capacitor,
wherein the current measurement circuit is coupled to a detection circuit configured to detect a fault of the at least one capacitor by comparing a change time of the measured voltage with a reference time.

15. The storage device of claim 12,
wherein the open state is an electrical open type of abnormal state,
wherein the short state is an electrical short type of abnormal state,
wherein the second path has an impedance lower than an impedance of the first path.

16. A memory system comprising:
a power loss protection (PLP) circuit having an auxiliary power device including at least one capacitor;
a charging circuit including a switching circuit connected with the auxiliary power device that is turned on and off and configured to supply power to the auxiliary power device;
a main system circuit including a controller and at least one memory chip; and
a power block arranged between the PLP circuit and the main system circuit and configured to supply power to the main system circuit,
wherein the PLP circuit comprises a state determining circuit configured to measure a voltage of the at least one capacitor and determine a fault of the at least one capacitor by comparing a change time of the measured voltage with a reference time, and
the state determining circuit comprises a path circuit connected in parallel with the at least one capacitor and configured to form a second path having a resistance value that is less by a threshold value than a resistance value of a first path for leakage current of the at least one capacitor,
wherein the state determining circuit is configured to determine an abnormal state as an open state if a time of an off period of the switching circuit is shorter than a time of a preset first period when a voltage of the at least one capacitor aperiodically cycles between a first voltage level and a second voltage level.

17. The memory system of claim 16, wherein
the charging circuit is configured to apply a voltage to the at least one capacitor, and
the state determining circuit is configured to measure a time of a charge/discharge period of the at least one capacitor and determine the fault of the at least one capacitor by comparing the measured time of the charge/discharge period with the reference time.

18. The memory system of claim 17, wherein
the second path comprises at least one current source, and
the at least one current source is mounted together with the auxiliary power device in the PLP circuit.

19. The memory system of claim 17, wherein
the path circuit comprises a first resistor and a second resistor that are connected in series to form the second path, and is configured to feed back a feedback voltage to the charging circuit through a node to which the first resistor and the second resistor are connected to maintain substantially constant a voltage applied to the at least one capacitor.

20. The memory system of claim 16,
wherein the state determining circuit is configured to determine a state of the auxiliary power device to be in a normal state if a voltage of the at least one capacitor periodically cycles between the first voltage level and the second voltage level that is lower than the first voltage level; and
wherein the state determining circuit is configured to determine the abnormal state as a short state if the voltage of the at least one capacitor is measured as being lower than or equal to a third voltage level that is lower than the second voltage level.

* * * * *

UNITED STATES PATENT AND TRADEMARK OFFICE
CERTIFICATE OF CORRECTION

PATENT NO. : 11,295,785 B2
APPLICATION NO. : 16/877752
DATED : April 5, 2022
INVENTOR(S) : Lee et al.

It is certified that error appears in the above-identified patent and that said Letters Patent is hereby corrected as shown below:

In the Specification

Column 12, Lines 32-47, should read:
When the state determining circuit 300 detects the first voltage and the second voltage of the auxiliary power device 200, a timer (not shown) may measure a time of a charge period and/or a time of a discharge period of the charging circuit 100. More specifically, the discharge period is a period in which the voltage of the auxiliary power device 200 drops from the first voltage to the second voltage, and thus may correspond to an off period of an FET (110 of FIG. 2) of the DC-DC converter of the charging circuit 100 or a switch-on state of the switching circuit. More specifically, the charge period is a period in which the voltage of the auxiliary power device 200 rises from the second voltage to the first voltage, and thus may correspond to an on period of the FET (110 of FIG. 2) of the DC-DC converter of the charging circuit 100 or a switch-off state of the switching circuit.

Signed and Sealed this
Fifteenth Day of November, 2022

Katherine Kelly Vidal
*Director of the United States Patent and Trademark Office*